United States Patent [19]

Miyoshi et al.

[11] 4,143,385
[45] Mar. 6, 1979

[54] PHOTOCOUPLER

[75] Inventors: Tadahiko Miyoshi, Hitachi; Yasutoshi Kurihara, Katsuta, both of Japan

[73] Assignee: Hitachi, Ltd., Japan

[21] Appl. No.: 837,710

[22] Filed: Sep. 29, 1977

[30] Foreign Application Priority Data

Sep. 30, 1976 [JP] Japan .................................. 51/117789
Dec. 25, 1976 [JP] Japan .................................. 51/157157

[51] Int. Cl.² ................... H01L 33/00; H01L 31/12; H01L 31/16
[52] U.S. Cl. ......................................... 357/19; 357/17; 357/65; 357/68; 357/67; 357/75; 427/82; 250/551
[58] Field of Search ......................... 357/65, 67, 68, 17, 357/19, 75; 250/551; 427/82

[56] References Cited

U.S. PATENT DOCUMENTS

| 2,609,429 | 9/1952 | Law | 357/68 |
|---|---|---|---|
| 3,351,698 | 11/1967 | Marinace | 357/65 |
| 3,355,635 | 11/1967 | Baumann | 357/65 |
| 3,366,793 | 1/1968 | Svedberg | 357/75 |
| 3,370,174 | 2/1968 | Toussaint | 357/75 |
| 3,456,335 | 7/1969 | Hennings et al. | 357/65 |
| 3,871,015 | 3/1975 | Lin et al. | 357/65 |
| 3,886,581 | 5/1975 | Katsumura | 357/75 |
| 4,005,457 | 1/1977 | Hill et al. | 357/65 |
| 4,012,833 | 3/1977 | Akiyama | 357/65 |
| 4,058,821 | 11/1977 | Miyoshi et al. | 357/19 |

*Primary Examiner*—Andrew J. James
*Attorney, Agent, or Firm*—Craig & Antonelli

[57] ABSTRACT

A photocoupler wherein a semiconductor photoresponsive element and a semiconductor light emitting element are arranged on an insulating substrate in such a mannner that they oppose each other with a P-N junction of the latter being perpendicular to a light receiving face of the former. At least one of the elements is connected with electric wiring on the insulating substrate by the use of a brazing material at three or more points which lie on an identical plane of the insulating substrate but do not lie on one straight line.

12 Claims, 25 Drawing Figures

PHOTOCOUPLER

BACKGROUND OF THE INVENTION

The present invention relates to improvements in a photocoupler.

Photocouplers are optical coupling devices which include a semiconductor light emitting element and a semiconductor photo responsive element. They are presently often used for the isolation of solid state relays and transmission lines. Also, a photocoupler array consisting of a plurality of photocouplers mounted on the same substrate or a combined circuit consisting of a photocoupler and an integrated circuit are very advantageous for logic circuits and audio circuits.

As the semiconductor light emitting element for the photocoupler, except in case where a very rapid response is required as for communication, an Si-doped GaAs infrared light emitting diode fabricated by liquid phase epitaxial growth is usually employed for the reasons:

(1) that the luminous efficiency is high, and
(2) that the emission wavelength is approximately 9,400 Å to which an Si photo responsive element is highly sensitive.

Usually, the size of the semiconductor light emitting element is approximately 0.3 × 0.3 mm$^2$ or larger for easy handling.

As illustrated in FIG. 2 and FIG. 4 in the official gazette of Japanese Patent Application Publication No. 17862/1967, there are two methods for mounting the semiconductor light emitting element with respect to the semiconductor photo-responsive element.

The first method disposes a P-N junction in the semiconductor light emitting element in parallel with the light receiving face of the semiconductor photo responsive element as shown in FIG. 2 in the official gazette. The photocoupler of such construction is called the principal surface emission type. According to the second method, as shown in FIG. 4 in the official gazette, a P-N junction in the semiconductor light emitting element is disposed perpendicularly to the light receiving face of the semiconductor photo-responsive element. The photocoupler of such an arrangement is termed the side surface emission type.

In the semiconductor light emitting element, the light emission takes place in the vicinity of the P-N junction. Part of the emitted light is absorbed within the crystal of the semiconductor light emitting element, while the remaining part is radiated to the exterior. Accordingly, the brilliance of the radiated light is the highest in the direction of the side surface to which the P-N junction is exposed, and it is comparatively low in the direction of the principal surface under the influence of the internal absorption. In this connection, the brilliance of the light in the direction of the principal surface is about half of that of the light in the direction of the side surface.

In the principal surface emission type photocoupler, the light is radiated from the whole principal surface of the semiconductor light emitting element. Therefore, in case where the light receiving region of the semiconductor photo-responsive element has substantially the same area as that of the principal surface of the semiconductor light emitting element, a major portion of the radiated light reaches the light receiving region and a comparatively high optical coupling efficiency is exhibited. However, when the size of each light receiving region is made small in order to raise the degree of integration of the semiconductor photo responsive elements, a mere fraction of the radiated light reaches the light receiving region, and the remaining light falls on another region of the semiconductor photo-responsive element. As a result, the optical coupling efficiency becomes low. Moreover, the light falling on areas other than the light receiving region becomes stray light and gives rise to malfunctions of the semiconductor photo-responsive element. It has therefore been impossible to make the degree of integration high in a photocoupler array or in a combined device consisting of a photocoupler and an integrated circuit.

On the other hand, in the side surface emission type photocoupler, the width of a light emitting region is as small as about 50 μm, and the light receiving region can be made small accordingly. It is therefore possible to enhance the degree of integration.

Since, however, both the light receiving region and the light emitting region are small, the optical coupling efficiency is not raised satisfactorily unless both the regions are exactly aligned.

SUMMARY OF THE INVENTION

One object of the present invention is to provide a photocoupler having a high light transmission efficiency and a high degree of integration.

Another object of the present invention is to provide a photocoupler having high reliability.

A further object of the present invention is to provide a photocoupler having a structure suitable for mass production.

With these and other objects in view, the present invention provides a semiconductor photo-responsive element and a semiconductor light emitting element arranged on an insulating substrate in a manner to oppose to each other a P-N junction of the latter element is perpendicular to a light receiving face of the former element. At least one of the elements is connected with electric wiring on the insulating substrate by the use of a brazing material at three or more points which lie on an identical plane of the insulating substrate but do not lie on one straight line.

DETAILED DESCRIPTION

Figure 1:
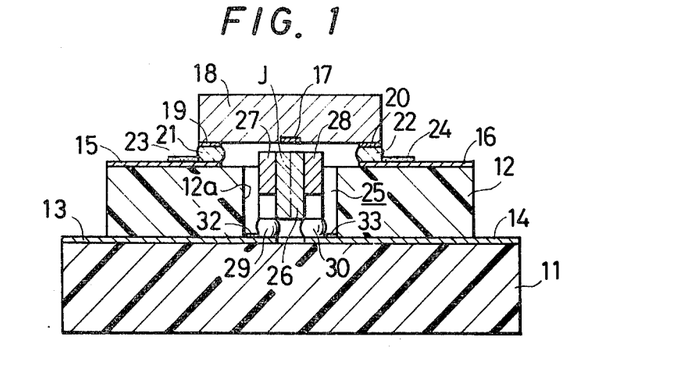
FIG. 1 is a vertical sectional view of a photo-coupler showing an embodiment of the present invention.
Figure 2:
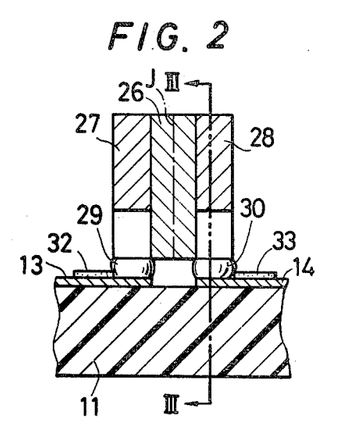
FIG. 2 is a view showing on enlarged scale the mounting portion of a semiconductor light emitting element in the photocoupler shown in FIG. 1.
Figure 3:
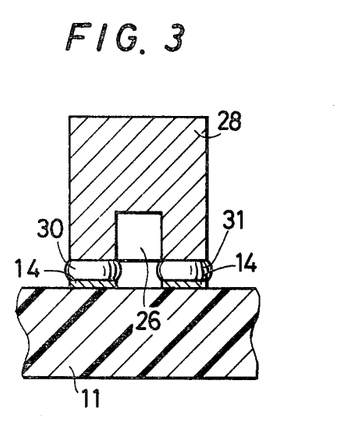
FIG. 3 is a transverse sectional view of the mounting portion of the semiconductor light emitting element as taken along cutting-plane line III—III in FIG. 2.

Referring now to the drawings, and in particular, to to FIGS. 1 to 3, numerals 11 and 12 designate insulating substrates with substrate 12 being stacked on substrate 11. Electric interconnections of predetermined patterns, 13, 14, 15, and 16 are provided on the outer surfaces of the insulating substrates by a known technique such as selective evaporation. A semiconductor photo-responsive element 18 having a light receiving region 17 is mounted on the insulating substrate 12. Electrodes 19 and 20 of the semiconductor photo-responsive element 18 are electrically and mechanically spliced or connected with one group of electric interconnections 15 and 16 through a brazing material such as solder indicated at 21 and 22. On the electric interconnections 15 and 16, there are provided glass dams 23 and 24 which serve to regulate the bonding positions of the brazing portions 21 and 22 and to prevent the brazing portions 21 and 22 from flowing out towards other areas.

The insulating substrate 12 has a hole 12a, and a semiconductor light emitting element 26 is received within a recess 25 which is defined by both the insulating substrates 11 and 12. Electrodes 27 and 28 are provided on the principal surfaces of the semiconductor light emitting element 26 on both sides thereof. The electrodes 27 and 28 are electrically and mechanically spliced with the other group of electric interconnections 13 and 14 on the insulating substrate 11 by the use of a brazing material such as solder in two places for each (portions 29–31 are indicated). Numerals 32 and 33 designate glass dams which achieve the same function as that of the glass dams 23 and 24. The semiconductor light emitting element 26 has a P-N junction J the exposed surface of which is perpendicular to the light receiving region 17 of the semiconductor photo responsive element 18, so that both the elements 18 and 26 form a side surface emission type photocoupler. The electrodes 27 and 28 are inverted U-shaped, and the end parts of the electric interconnections 13 and 14 are divided in conformity with the end profiles of the electrodes 27 and 28 or predetermined patterns.

In this embodiment, the semiconductor light emitting element 26 is fixed to the insulating substrate 11 at the four corner positions of a tetragon, i.e., four points lying on an identical plane but not on one straight line, by the use of the brazing material at 29–31 (one more portion is not shown).

Accordingly, a highly precise parallelism is attained between the light emitting face of the semiconductor light emitting element 26 and the light receiving face of the semiconductor photo responsive element 18. Both the elements 18 and 26 can be fixed to predetermined positions on the insulating substrates 11 and 12 owing to the self-alignment effect of the brazing portions 21, 22 and 29–31. Besides, since the photocoupler is of the side surface emission type, light of high brilliance can be caused to fall exactly on the light receiving region, and the enhancement of the photo-coupling efficiency can be achieved. Moreover, since the illumination by the light can be confined to the light receiving face of the semiconductor photo responsive element 18, the light receiving region 17 in the semiconductor photo responsive element 18 can be made small in size, the degree of integration can be enhanced, and the liklihood of a malfunction due to stray light is minimized. This results in a high reliability for the photocoupler.

When solder is used as the brazing material 21, 22 and 29–31 and the elements are bonded by face down bonding, the mass producibility of the photocoupler is high. The reliability thereof is also high as disconnection and like troubles do not occur. Since both the elements 18 and 26 can be brought into proximity without being hindered by the electrodes, the photo-coupling efficiency is high.

As the number of the fixing points becomes larger, the parallelism between both the elements 18 and 26 becomes higher. As the surface area of the brazing material becomes larger, the self-alignment effect of the brazing material develops more owing to the surface tension. It is therefore desirable that the number of the fixations by the brazing material is increased within a range not spoiling the job efficiency.

In order to achieve the beneficial results described above, at least one of the elements 18 and 26 needs to be fixed at, at least, three points which lie on an identical plane and which do not lie on one straight line.

Figure 4:
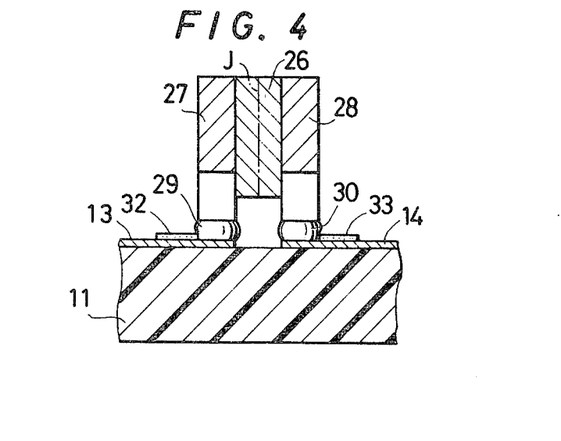
FIG. 4 is a vertical sectional view showing a modification of the semiconductor light emitting element shown in FIG. 2.

FIG. 4 shows a modification of the mounting portion of the semiconductor light emitting element. In this embodiment, the position of the lower end face of the semiconductor light emitting element 26 is higher than the position of the lower end faces of the electrodes 27 and 28. Thus, in the step of melting and securing the brazing material at 29 and 30, the brazing portions 29 and 30 do not spread to the lower end part of the semiconductor light emitting element 26, and it is not feared that the brazing material will short-circuit the P-N junction J thereby damaging electrical characteristics of the semiconductor light emitting element 26.

In FIG. 4, the same numerals as in FIGS. 1 to 3 designate the same or equivalent components.

As the electrodes 27 and 28 of the semiconductor light emitting element 26 becomes thicker, the heat radiation of the element 26 is better and the life of the element 26 is longer. From the standpoint of the heat radiation, Ag, Cu, Au etc. are excellent as a metal for the electrodes 27 and 28. In particular, Ag and Cu are inexpensive, and they have the advantage that relatively inexpensive and highly reliable Pb - Sn solder can be employed as the brazing material. In the case of employing Cu for the electrodes 27 and 28, stopper layers which are made of Ni or the like adapted to check the passage of Cu may be interposed between the Cu electrodes and the semiconductor light emitting element 26. This prevents lowering of the luminous efficiency due to the diffusion of Cu into the semiconductor light emitting element 26.

The thickness of the electrodes 27 and 28 is desired to be approximately 100μ or greater. When the electrodes are too thin, the area of their contact with the brazing portions 29-31 becomes small, and a predetermined bonding strength of the semiconductor light emitting element cannot be ensured. When they are too thick, the operation of dividing each of their lower ends into a plurality of parts becomes difficult, and the divided end profile lowers in precision. In this regard, therefore, the thickness is desired to be at most approximately 300μ.

As an expedient for providing the semiconductor light emitting element 26 with each of the electrodes 27 and 28, there is first contrived a method wherein a metal plate is bonded with a brazing material such as Au - Ge and Au - Si. Secondly, there is contrived a method wherein a metal layer of Au or the like is deposited on the semiconductor light emitting element and wherein a thick metal layer is formed thereon by the plating.

From the viewpoint of the mass producibility, it is desirable to form metal layers on a GaAs wafer and then cut the resultant structure into semiconductor light emitting element pellets. It is extremely difficult, however, to cut the thick metal layers and the GaAs wafer at the same time and at high accuracy. Therefore, metal plates worked into a predetermined pattern in advance may be bonded. As an alternative, after bonding metal plates, they may be worked into a predetermined pattern by removing their parts to be cut away with the photoetching technique. In the case of relying on the plating, the selective plating may be adopted. In the case where the surface carrier concentration of the GaAs wafer is made high in advance, it is possible to directly plate the surfaces of the GaAs wafer with Au or Ag. The metals Ag and Cu can easily execute the selective plating by electroplating.

Figure 5:
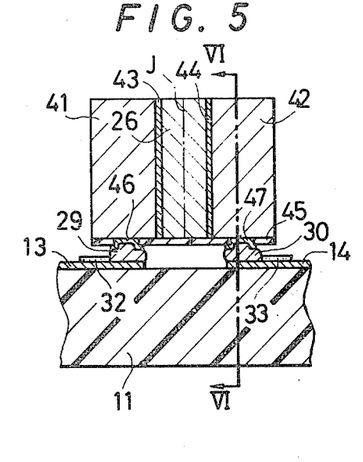
FIG. 5 is a vertical sectional view showing the mounting portion of a semiconductor light emitting element according to another embodiment of this invention.
Figure 6:
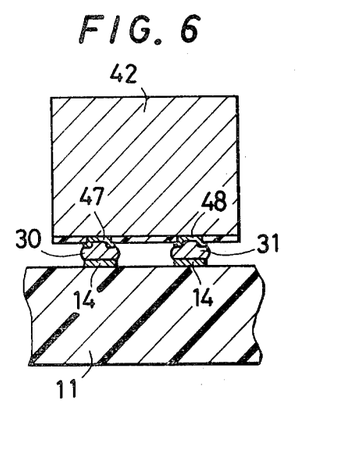
FIG. 6 is a transverse sectional view of the mounting portion of the semiconductor light emitting element as taken along cutting-plane line VI—VI in FIG. 5.

FIGS. 5 and 6 show an example wherein, instead of the metal, a semiconductor is employed for the electrodes of the semiconductor light emitting element illustrated in FIGS. 1 to 4. In both these figures, the same symbols as in FIGS. 1 to 3 represent the same or equivalent components. Referring to FIGS. 5 and 6, numerals 41 and 42 designate electrodes made of silicon of low resistance, which are bonded to both the principal surfaces of the semiconductor light emitting element 26 by brazing material portions 43 and 44 respectively. An SiO₂ insulating film 45 is provided on the lower surfaces of the semiconductor light emitting element 26 and both the Si electrodes 41 and 42 (i.e., on the surfaces on the side on which the element 26 including the electrodes 41 and 42 is to be secured by the brazing material portions 29-31). The SiO₂ film 45 is provided with openings, through which metal films 46, 47 and 48 are held in ohmic contact with the Si electrodes 41 and 42. The metal films 46-48 are spliced with the electric interconnections 13 and 14 through the brazing material portions 29-31.

The SiO₂ film 45 prevents the brazing material 29-31 from flowing out laterally onto the Si electrodes 41-42 in bonding and fixing the semiconductor light emitting element 26 to the insulating substrate 11. In such electrode construction, by using solder as the brazing material 29-31 and adopting face down bonding, the reproducibility of the manufacturing process is high. The reproducibility of the bonding strength is also high. The metal layers 46-48 may be thin, and their positions and shapes can be controlled very precisely. Therefore, the alignment precision with respect to the electric interconnections 13-14 is higher in this embodiment than in the previous embodiments shown in FIGS. 1-4.

As the brazing material 29-31, Pb - Sn solder is the most excellent because the price is low, the reliability is high, and the melting point is not very high (e.g. typically below about 330° C.).

When a material having a high melting point is used as the brazing material 29-31, group-V elements volatilize from the surfaces of the semiconductor light emitting element 26 due to heating at the bonding job, and the luminous efficiency of the semiconductor light emitting element 26 is lowered. This influence appears conspicuously at a temperature above 450° C. It is therefore desirable to employ as the brazing material 29-31 a material whose melting point is 450° C. or lower.

Figure 7:
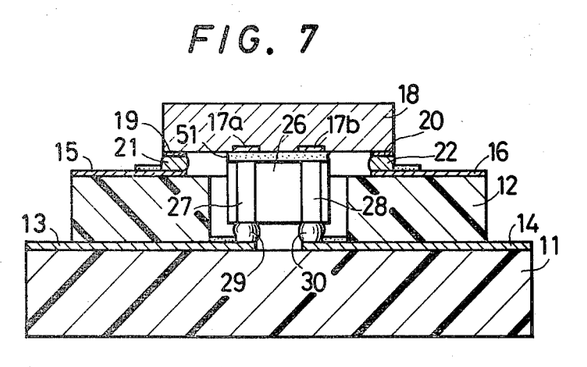
FIGS. 7 and 8 are vertical sectional views showing different embodiments of photo coupler arrays obtained by applying the present invention.
Figure 8:
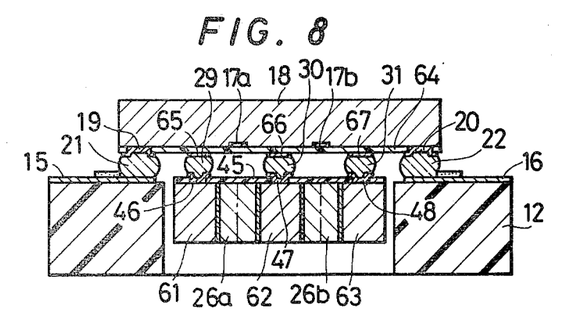

FIGS. 7 and 8 are views each showing a photocoupler array in which the photocoupler of this invention is applied. In both these figures, the same symbols as in FIGS. 1 to 6 denote the same or equivalent components.

Referring to FIG. 7, the semiconductor photo-responsive element 18 has light receiving regions 17a and 17b along a P-N junction of the semiconductor light emitting element 26. Light emitted from the semiconductor light emitting element 26 is efficiently led to the light receiving regions 17a and 17b of the semiconductor photo responsive element 18 by an optical guide 51 made of a transparent resin.

In the illustrated example, the light receiving regions 17a and 17b are caused to simultaneously function by the light emission of the semiconductor light emitting element 26.

Referring to FIG. 8, symbols 26a and 26b designate semiconductor light emitting elements. Numerals 61 to 63 indicate electrodes of both the elements 26a and 26b which are made of silicon. The semiconductor photo responsive element 18 having light receiving regions 17a and 17b is electrically and mechanically spliced with the electric interconnections 15 and 16 on the insulating substrate 12 through the electrodes 19 and 20 as well as the brazing portions 21 and 22.

An insulating SiO₂ film 64 adapted to transmit light is provided on the lower surface of the semiconductor photo-responsive element 18, and electric interconnections 65 to 67 are provided in a manner to be kept away from the light receiving regions 17a and 17b.

The stacked and bonded body consisting of the semiconductor light emitting elements 26a, 26b and the Si electrodes 61-63 is electrically and mechanically spliced with the electric interconnections 65-67 through electrodes 46-48 on the electrodes 61-63 as well as the brazing portions 29-31.

In this embodiment, the electrode 62 is commonly used, and by impressing a signal on the electrode 61 or 63, the light receiving regions 17a and 17b can be caused to function simultaneously or independently. Since the semiconductor light emitting elements 26a and 26b are fixed directly on the semiconductor photo-responsive element 18, the alignment precision between both the sorts of elements is especially higher than in the embodiments described previously.

Of course, in both the embodiments of FIGS. 7 and 8, the brazing material portions are provided in three or more places lying on an identical plane and not on one straight line in accordance with this invention.

Referring now to FIGS. 9(a) to 9(f), an example of the manufacturing process of the photocoupler array shown in FIG. 7 will be explained.

Figure 9A:
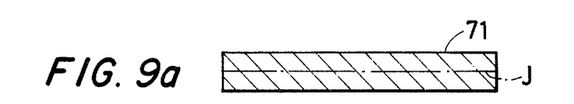
FIGS. 9(a) through 9(f) are views showing the manufacturing steps of the photocoupler array illustrated in FIG. 7.
Figure 9B:
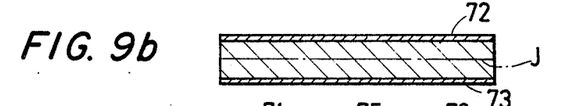
Figure 9C:
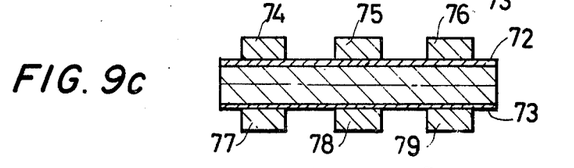
Figure 9D:
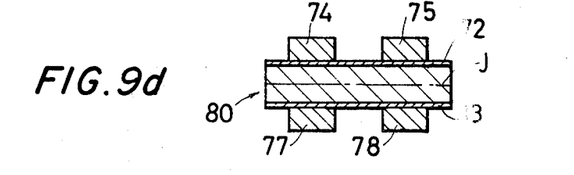
Figure 9E:
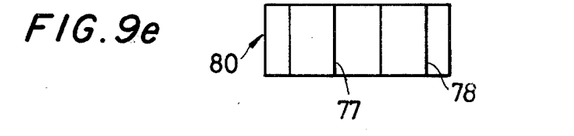

As shown in FIG. 9(a), an Si-doped n-type GaAs layer and subsequently an Si-doped p-type GaAs layer were grown on an n-GaAs substrate by conventional methods to produce a substrate 71 including a p-n junction J. By lapping the substrate, the thickness of the whole wafer was made 200μ. Thereafter, as shown in FIG. 9(b), a layer 72 of an Au - Ge - Ni alloy and Au was evaporated on the n-side of the substrate 71, while a layer 73 of an Au - Zn alloy and Au was evaporated on the p-side. Subsequently, as shown in FIG. 9(c), Ag was deposited to a thickness of 150μ by selective plating by using photoresist films as masks, to obtain a structure in which Ag layers 74 through 79 were bonded to predetermined places of the wafer. After heating the resultant wafer in H$_2$ at 350° C., it was cut into a size of 0.4 × 0.4 mm$^2$ with a diamond cutter, and the cut surfaces were lapped. Then, a semiconductor light emitting element 80 of a structure shown in FIG. 9(d) was obtained. This light emitting element 80 corresponds to the element 26 shown in FIG. 7. FIG. 9(e) is a side view of the semiconductor light emitting element 80 shown in FIG. 9(d).

On the other hand, ceramics multilayer interconnection substrates 11 and 12 which defined a recess at a part thereof as illustrated in FIG. 7 were prepared. They were immersed in molten solder (Sn/Pb), to deposit solder portions 21, 22 and 29 through 31 on electric interconnections 13 through 16. As a semiconductor photo-responsive element 18, there was prepared one of a structure wherein three photothyristors each having a size of 0.05 × 0.10 mm$^2$ were placed on one straight line. Al, Cr, Cu, Au and solder were continuously deposited on electrode portions 19 and 20 of the photo-responsive element.

Figure 9F:
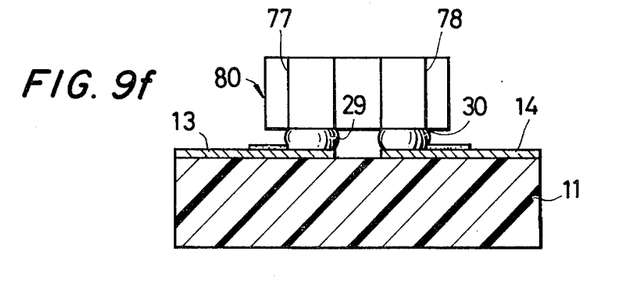

Subsequently, the semiconductor light emitting element 80 was disposed so that Ag layers might lie just over the electric interconnections 13 and 14 in the recess defind by the multilayer ceramics substrates as shown in FIG. 7. The semiconductor photo-responsive element 18 was disposed so that the electrodes 19 and 20 of the element 18 might lie over the electric interconnections 15 and 16 on the upper surface of the ceramics substrate. The resultant structure was heated to 330° C., to fuse the solder and to bond the semiconductor photo-responsive element 18 and the semiconductor light emitting element 80. At this step, the self-alignment effect acted owing to the surface tension of the solder, and both the semiconductor photo responsive element 18 and the semiconductor light emitting element 80 were aligned with their electrodes disposed right above the electric interconnections on the respectively corresponding insulating substrates. FIG. 9(f) shows the mounting structure of the semiconductor light emitting element 80 in the photocoupler fabricated by the process described above.

In this manner, the alignment of the semiconductor photo-responsive element and the semiconductor light emitting element are automatically carried out in the photocoupler of the structure according to this invention, so that the mass producibility in the manufacturing process is high. The precision of the alignments is high, and in the experiment of the present embodiment, the misalignment between the light emitting region and the light receiving region could be suppressed within ± 30 μ. In addition, the light emitting region is as narrow as about 50 μ, and the light receiving regions are juxtaposed along the light emitting region, so that the light transmission or conveyance efficiency is high. With the structure wherein transparent silicone rubber 51 was interposed between the light emitting region and the light receiving regions as shown in FIG. 7, the light transmission efficiency reached 65%. Yet, in addition, the light emitting region is narrow, and the spacing between the light emitting elements can be made as short as about 0.1 mm. Therefore, stray light was not any appreciable problem.

In contrast, a prior-art structure which exploited light emission from the principal surface, had a light transmission efficiency as low as one quarter of that of the present embodiment. Also stray light was greatly influential, for the reasons (1) that since the light emitting region became much larger than the light receiving region, light illuminated areas of the photo responsive element other than the light receiving region, and (2) that it was difficult to provide a short distance between the photo-responsive element and the LED.

By the same method as in the above embodiment, there were fabricated samples in which the thickness of the plating layers was varied as 50μ, 100μ, 300μ and 500μ. As the result, it was revealed that the dispersion of the sectional shapes of the plating layers within the wafer becomes great with the thickness of the plating layers, so that the alignment precision of the light emitting element tends to become inferior with the increase of the layer thickness. It was revealed that when the thickness of the plating layers becomes 500μ, the misalignment between the light emitting region and the light receiving region becomes beyond ± 50μ and exceeds the width (about 50μ) of the light emitting region. Such a layer thickness therefore becomes unfeasible. On the other hand, it was also revealed that as the plating layers become thinner, the bonding strength of the light emitting element onto the insulating substrate becomes lower. Thus, a plating layer thickness of 50μ is unusable. A similar fact was noticed in the case where, in place of the selective formation of the plating layers, the metal plates were bonded to the GaAs wafer and then worked by the photoetching technique. This led to the results that when the thickness of the metal plates is above 300μ, the pattern precision becomes inferior, and that when the thickness of the metal plates is below 100μ, the bonding strength of the light emitting element is defective. From these results, it is considered that values of 100–300μ are suitable as the thickness of the metal layers to be provided on the light emitting element.

Further, as to samples wherein, in place of the Ag plating in the foregoing embodiment, 1μ of Ni and 150μ of Cu were deposited by selective plating, a face down bonding of high positional accuracy was possible as in the Ag-plated samples. Still further, when a direct current of 30 mA was caused to flow through the light emitting element (0.3 × 0.4 mm$^2$) of the photocoupler, the temperature rise was 10° C. It was thus revealed that the temperature rise is about one half of a value exhibited by the light emitting element of the prior-art photocoupler of the principal surface emission type, and that as the result, the life of the light emitting element becomes about 1.5 times the life of the light emitting element of the prior-art structure.

Now, an example of the manufacturing process of the photo coupler shown in FIGS. 5 and 6 will be explained with reference to FIGS. 10(a) to 10(g).

Figures 10, 10A:
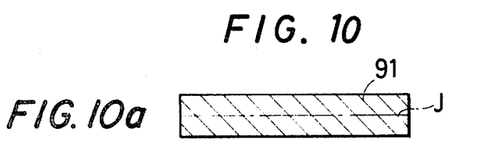
FIGS. 10(a) through 10(g) are views showing the manufacturing steps of the photocoupler illustrated in FIGS. 5 and 6.
Figure 10B:
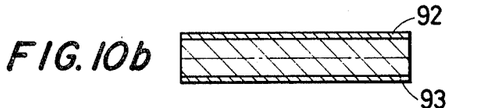
Figure 10C:
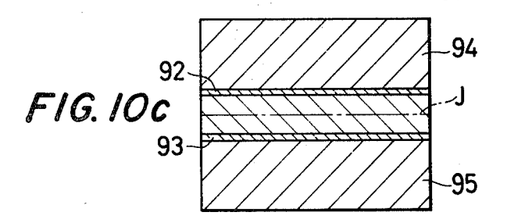

As shown in FIGS. 10(a) and 10(b), on both the principal surfaces of an Si-doped GaAs substrate 91 including a p-n junction J as fabricated in the same way as in the case of FIGS. 9(a) – 9(f), there were respectively evaporated a layer 92 of an Au - Ge - Ni alloy and Au and a layer 93 of an Au - Zn alloy and Au. Thereafter, as shown in FIG. 10(c), the substrate 91 was sandwiched in between silicon plates (specific resistance: 0.02Ω·cm) 94 and 95 being 5 mm thick. To form electrodes, and the resultant structure was heated to 400° C. in H$_2$ to bond the substrate 91 and the silicon substrates 94 and 95 by metal layers 92 and 93. Subsequently, the substrate was cut perpendicularly to the p-n junction J, and the cutting surfaces were lapped and flattened.

Figure 10D:
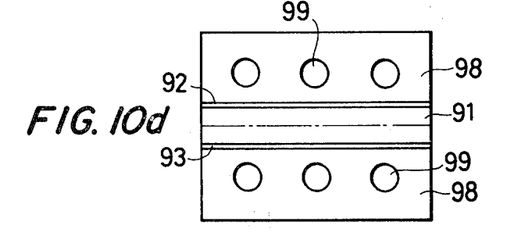
Figure 10E:
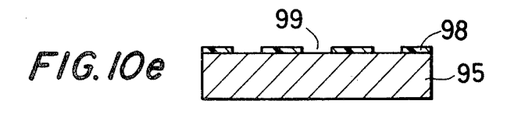

Subsequently, as illustrated by a plan in FIG. 10(d) and a section in FIG. 10(e), an SiO$_2$ film 98 having a thickness of 1μ was formed on the lapped surface by sputtering, and windows 99 were provided by the technique of photoetching. Subsequently, as shown in FIG. 10(f), laminated metal layers of Al, Cr, Cu and Au 100 and solder (Sn/Pb) layers 101 were mask-evaporated to areas of the windows 99.

Figure 10F:
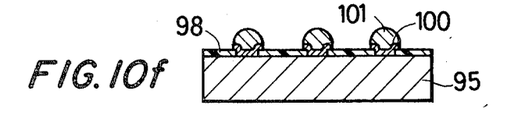
Figure 10G:
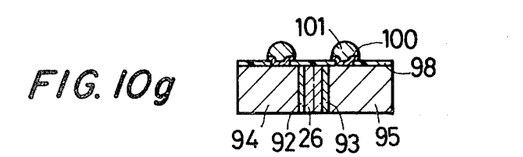

Lastly, the structure of FIG. 10(f) was split into light emitting element chips each of which had four of the solder layers as understood from FIG. 10(g). Thereafter, the chip was disposed on the electric interconnections 13 and 14 of the insulating substrate 11 as shown in FIGS. 5 and 6. The resultant structure was heated to 300° C., to fuse the solder and to splice the Si electrodes 41 and 42 of the light emitting element 26 and the electric interconnections 13 and 14 by the solder 101 (29 through 31 in FIGS. 5 and 6).

In the present embodiment, the technique of face down bonding generally employed in the silicon semiconductor industry could be applied to the step of mounting the electrodes of the light emitting element without any alteration, and hence, the reproducibility of the operations was high. Since the shape of the metal layer 100 to have the solder 101 bonded thereto could be precisely controlled, the positional accuracy of the light emitting element could be made as high as about ± 15μ.

Figure 11:
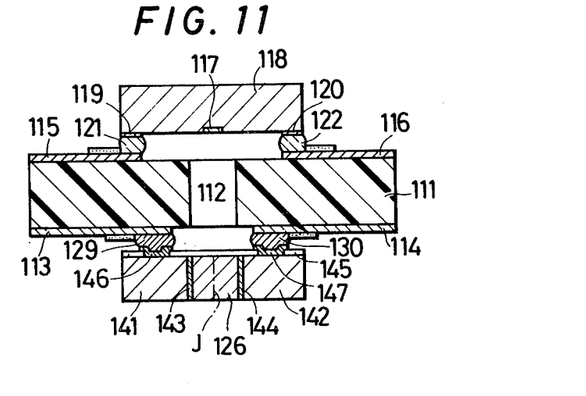
FIG. 11 is a vertical sectional view of a photo-coupler showing another embodiment of this invention.

FIG. 11 shows an embodiment in the case where the enhancement of the photo-coupling efficiency by the distance between the semiconductor light emitting element and the semiconductor photo-responsive element is not very important and where a high insulation between both the elements is to be attained.

Referring to FIG. 11, numeral 111 designates an insulating substrate which has a hole 112 and which is provided with electric interconnections 113–116 on the upper and lower principal surfaces thereof. A semiconductor photo responsive element 118 having a light receiving region 117 is electrically and mechanically spliced to the electric interconnections 115 and 116 by electrodes 119 and 120 and brazing material portions 121 and 122. A semiconductor light emitting element 126 having a P-N junction J has Si electrodes 141 and 142 secured to both its principal surfaces by metal films 143 and 144. An SiO$_2$ film 145 is provided on the upper principal surfaces of both the electrodes 141 and 142 and the semiconductor light emitting element 126. The electrodes 141 and 142 are provided with metal films 146 and 147 through openings formed in the SiO$_2$ film 145, and they are spliced with the electric interconnections 113 and 114 through brazing material portions 129 and 130.

Although only the two brazing portions 129 and 130 are shown in the figure, the light emitting element is mounted by at least three brazing portions in accordance with this invention, and hence, the parallelism between both the elements is achieved.

Emitted light from the semiconductor light emitting element 126 illuminates the light receiving region 117 of the semiconductor photo-responsive element 118 through the hole 112 of the insulating substrate 111.

In the present embodiment, the distance between both the elements 118 and 126 is long, so that the photocoupling efficiency is lower than in the cases of FIGS. 1, 7 and 8. However, the insulation distance becomes great, with the result that a high withstand voltage is gained.

Figure 12:
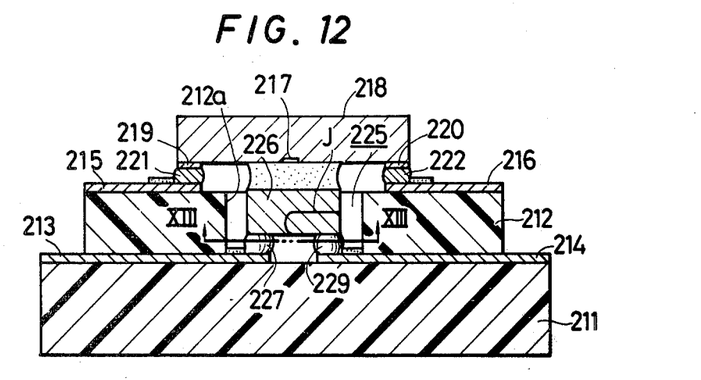
FIG. 12 is a vertical sectional view of a photo-coupler showing still another embodiment of this invention.
Figure 13:
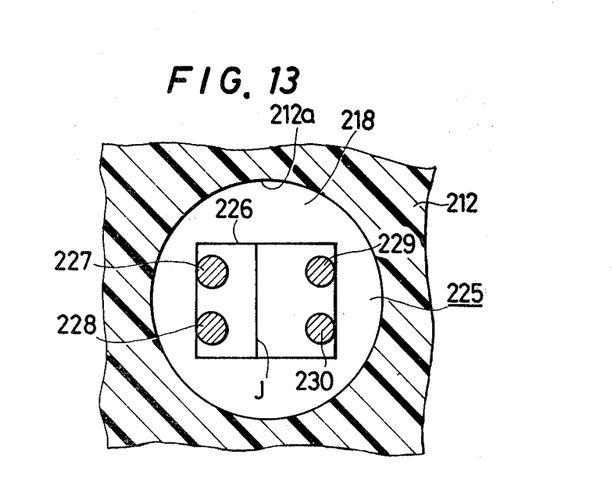
FIG. 13 is a cross-sectional view of the mounting portion of a semiconductor light emitting element as taken along cutting-plane line XIII—XIII in FIG. 12.

FIGS. 12 and 13 show an example wherein this invention is applied to a combined type photocoupler which exploits lights from both principal surface and side surface.

In both these figures, numerals 211 and 212 designate insulating substrates, and numerals 213 to 216 electric interconnections. Numeral 218 indicates a semiconductor photo-responsive element which has a light receiving region 217 and which is spliced with the electric interconnections 215 and 216 by electrodes 219 and 220 and brazing portions 221 and 222. A semiconductor light emitting element 226 having a P-N junction J is received in a recess 225 formed by a hole 212a of the insulating substrate 212, and is spliced with the electric interconnections 213 and 214 through brazing portions 227–230 provided in accordance with this invention.

The P-N junction J of the semiconductor light emitting element 226 has a part parallel to the principal surface thereof and a part orthogonal to the same. The former constitutes a principal surface emission type photocoupler, and the latter a side surface emission type photocoupler. Both lights emitted from the two parts illuminate the light receiving region 217.

As clearly shown in FIG. 13, the semiconductor light emitting element 226 is fixed at four points defining a tetragon by means of the brazing portions 227–230. It is therefore possible to attain a favorable parallelism of the element 226 with respect to the semiconductor photo responsive element 218.

Figure 14:
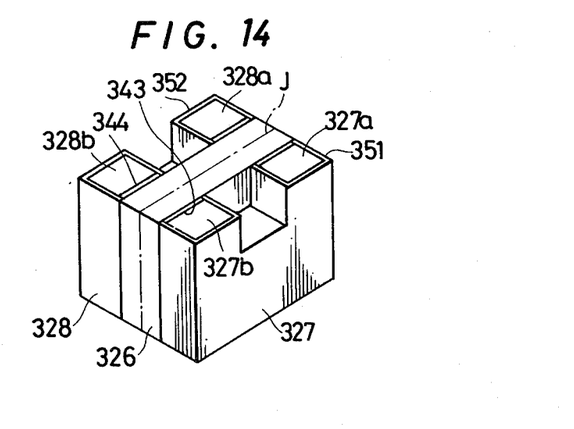
FIG. 14 is a perspective view of the mounting portion of a semiconductor light emitting element showing a further embodiment of this invention.

FIG. 14 shows an embodiment wherein an improvement capable of further enhancing the parallelism and the alignment precision is applied.

On both of the principal surfaces of a semiconductor light emitting element 326, electrodes 327 and 328 are secured by metal layers 343 and 344. Except for parts 327a, 327b and 328a, 328b to which brazing material portions are to be secured, the electrodes 327 and 328 are provided with films 351 and 352 to which the brazing material is difficult to adhere. Specifically, the films are made of an oxide of a metal of the electrodes, e.g., CuO or Ag$_2$O, or SiC, Cr$_2$O$_3$, Fe$_2$O$_3$, Si$_3$N$_4$, MnO, germanium nitride, SiO$_2$ or Al$_2$O$_3$. In the case of employing the films of the oxide of the electrode metal, the step of providing the films is simple. In addition, even when the electrodes have a complicated configuration, the films can be reliably formed because mere oxidation is required.

Owing to the provision of the films 351 and 352, in splicing the end parts 327a, 327b, 328a and 328b to electric interconnections on an insulating substrate by the brazing material, the brazing material is prevented from spreading up to other areas than the end parts of the electrodes 327 and 328. If the brazing material spreads so, the semiconductor light emitting element will be secured in an inclined state, or it will undergo a misalignment.

If, in the case of disposing the semiconductor light emitting element and the semiconductor photo-responsive element as closely as about 100μ, either element is secured in an inclined state, both the elements will come into contact and spoil the insulation, or a malfunction ascribable to the electrostatic coupling may result. Besides, in the case of providing an optical guide between both the elements as shown in FIG. 7, it will be impossible to mount the optical guide in a predetermined shape.

Further, the misalignment results in illumination of other areas than the light receiving region of the semiconductor photo responsive element. This causes lowering in the photo-coupling efficiency, and malfunctions attributed to stray light.

In this embodiment, however, the films 351 and 352 are provided and the securing areas of the brazing material are restricted. Therefore, the self-alignment effect of the brazing material acts effectively, and the parallelism between both the elements is attained favorably. Accordingly, the above drawbacks are not of concern.

Although, in the foregoing numerous examples, the present invention has been described as being applied to the semiconductor light emitting element, it is also applicable to the fixation of the semiconductor photo-responsive element. The application to both the elements is more effective than that to only one element.

It is to be understood that the above-identified arrangements are simply illustrative of the application of the principles of this invention. Numerous other arrangements may be readily devised by those skilled in the art which embody the principles of the invention and fall within its spirit and scope.

We claim:

1. In a photocoupler wherein a semiconductor photo-responsive element and a semiconductor light emitting element are opposed in a hole of an insulating substrate having two groups of electric interconnections in predetermined patterns, the photocoupler characterized in that a P-N junction of said semiconductor light emitting element is arranged perpendicularly to a light receiving face of said semiconductor photo-responsive element, and that at least one of the elements is spliced with the corresponding group of electric interconnections by a brazing material at, at least, three points which lie on an identical plane but do not lie on one straight line.

2. A photocoupler according to claim 1, wherein said semiconductor light emitting element has electrodes on principal surfaces on both sides thereof, both the electrodes have at least three end parts which lie on an identical plane but do not lie on one straight line, and said semiconductor light emitting element is spliced with the electric interconnections at the end parts by said brazing material.

3. A photocoupler according to claim 2, wherein both said electrodes are made of a metal selected from the group consisting of Ag and Cu.

4. A photocoupler according to claim 2, wherein both said electrodes are made of Si.

5. A photocoupler according to claim 1, wherein said brazing material is Pb - Sn solder.

6. A photocoupler according to claim 2, wherein a film to which said brazing material is difficult to adhere is provided on said electrodes in an area other than those end parts of both said electrodes which said brazing material secures.

7. A photocoupler according to claim 6, wherein said brazing material is Pb - Sn solder, and said film is made of one member selected from the group consisting of an oxide of a metal of said electrodes, SiC, $Cr_2O_3$, $Fe_2O_3$, $Si_3N_4$, MnO, germanium nitride, $SiO_2$ and $Al_2O_3$.

8. A photocoupler according to claim 1, wherein said semiconductor light emitting element has Si electrodes on principal surfaces on both sides thereof, an $SiO_2$ film is provided on surfaces of said electrodes on a side to be secured by said brazing material, metal layers are held in ohmic contact with said electrodes through openings provided in said $SiO_2$ film, and said brazing material secures said metal layers.

9. A photocoupler according to claim 1, wherein a part of said P-N junction of said semiconductor light emitting element is perpendicular to said light receiving face of said semiconductor photo responsive element.

10. A photocoupler comprising:
first and second insulating substrates which are stacked on each other, said first insulating substrate having a hole, above which a semiconductor photo-responsive element is arranged; and
a semiconductor light emitting element arranged in a recess defined by said hole of said first insulating substrate and said second insulating substrate, said semiconductor light emitting element having a P-N junction which is perpendicular to a light receiving face of said semiconductor photo-responsive element;
wherein said semiconductor photo-responsive element and said semiconductor light emitting element are spliced with electric interconnections on said first and second insulating substrates by a brazing material, and at least one the elements being spliced with said electric interconnections by said brazing material at, at least, three points which lie on an identical plane but do not lie on one straight line.

11. A photocoupler, comprising:
an insulating substrate which has a hole and which has two groups of electric interconnections in predetermined patterns on both principal surfaces thereof; and
a semiconductor photo-responsive element and a semiconductor light emitting element which are opposed to each other through said hole and which are spliced with the respective groups of the electric interconnections by a brazing material, a P-N junction of said semiconductor light emitting element being perpendicular to a light receiving face of said semiconductor photo-responsive element,
wherein at least one of the elements is spliced with the electric interconnections by said brazing material at, at least, three points which lie on an identical plane but do not lie on one straight line.

12. A photocoupler, comprising:
an insulating substrate which has a hole and which has first electric interconnections of a predetermined pattern on a principal surface thereof;
a semiconductor photo-responsive element which is spliced with said first electric interconnections by a brazing material so as to overlie said hole;
second electric interconnections of a predetermined pattern which are provided on a principal surface of said semiconductor photo-responsive element on the side opposite said insulating substrate; and
a semiconductor light emitting element which is spliced with said second electric interconnections by the brazing material, a P-N junction of said semiconductor light emitting element being perpendicular to a light receiving face of said semiconductor photo-responsive element,
wherein at least one of the elements is spliced with the corresponding electric interconnections by said brazing material at, at least, three points which lie on an identical plane but do not lie on one straight line.

* * * * *